US010707426B2

(12) United States Patent
Koch

(10) Patent No.: US 10,707,426 B2
(45) **Date of Patent: *Jul. 7, 2020**

(54) LIQUID CRYSTAL PHOTOALIGNMENT MATERIALS

(71) Applicant: Lomox Limited, Congleton (GB)

(72) Inventor: Gene Carl Koch, Eatontown, NJ (US)

(73) Assignee: Lomox Limited, Congleton (GB)

( * ) Notice: Subject to any disclaimer, the term of this patent is extended or adjusted under 35 U.S.C. 154(b) by 289 days.

This patent is subject to a terminal disclaimer.

(21) Appl. No.: 15/298,342

(22) Filed: Oct. 20, 2016

(65) Prior Publication Data

US 2017/0084846 A1 Mar. 23, 2017

Related U.S. Application Data

(63) Continuation of application No. 12/918,129, filed as application No. PCT/GB2009/000415 on Feb. 16, 2009, now Pat. No. 9,508,942.

(30) Foreign Application Priority Data

Feb. 18, 2008 (GB) .................................. 0802916.7

(51) Int. Cl.
*H01L 51/00* (2006.01)
*C09K 19/56* (2006.01)
(Continued)

(52) U.S. Cl.
CPC ........ *H01L 51/0076* (2013.01); *C08G 61/126* (2013.01); *C09K 19/56* (2013.01);
(Continued)

(58) Field of Classification Search
CPC . H01L 51/0076; H01L 51/56; H01L 51/0043; H01L 51/0003; H01L 51/0036; H01L 51/0094; H01L 51/007; H01L 51/0067; H01L 51/5293; H01L 51/0068; H01L 51/0095; H01L 51/0059;
(Continued)

(56) References Cited

U.S. PATENT DOCUMENTS 4,147,552 A 4/1979 Specht et al.
4,983,324 A 1/1991 Durr et al.
(Continued)

FOREIGN PATENT DOCUMENTS

CN 101085916 A 12/2007
CN 10133162 A 12/2008
(Continued)

OTHER PUBLICATIONS

Aldred et al., "A Full-Color Electroluminescent Device and Patterned Photoalignment Using Light-Emitting Liquid Crystals," *Advanced Materials*, vol. 17, No. 11, Jun. 2005, pp. 1368-1372.
(Continued)

*Primary Examiner* — Eli D. Strah
(74) *Attorney, Agent, or Firm* — Dority & Manning, P.A.

(57) ABSTRACT

A charge transporting, liquid crystal photoalignment material comprising a charge transporting moiety connected through covalent chemical bonds to a surface derivatising moiety, and a photoalignment moiety connected through covalent chemical bonds to a surface derivatising moiety.

10 Claims, 19 Drawing Sheets

(51) Int. Cl.

| | |
|---|---|
| ***C09K 19/58*** | (2006.01) |
| ***H01L 51/52*** | (2006.01) |
| ***C08G 61/12*** | (2006.01) |
| ***H01L 51/56*** | (2006.01) |
| *H01L 51/50* | (2006.01) |

(52) U.S. Cl.

CPC .......... *C09K 19/582* (2013.01); *C09K 19/584* (2013.01); *H01L 51/0003* (2013.01); *H01L 51/007* (2013.01); *H01L 51/0036* (2013.01); *H01L 51/0043* (2013.01); *H01L 51/0059* (2013.01); *H01L 51/0067* (2013.01); *H01L 51/0068* (2013.01); *H01L 51/0069* (2013.01); *H01L 51/0071* (2013.01); *H01L 51/0072* (2013.01); *H01L 51/0073* (2013.01); *H01L 51/0074* (2013.01); *H01L 51/0094* (2013.01); *H01L 51/0095* (2013.01); *H01L 51/5293* (2013.01); *H01L 51/56* (2013.01); *B32B 2457/206* (2013.01); *C08G 2261/124* (2013.01); *C08G 2261/144* (2013.01); *C08G 2261/228* (2013.01); *C08G 2261/312* (2013.01); *C08G 2261/3223* (2013.01); *C08G 2261/3242* (2013.01); *C08G 2261/512* (2013.01); *C08G 2261/522* (2013.01); *C08G 2261/53* (2013.01); *C08G 2261/95* (2013.01); *C09K 19/58* (2013.01); *H01L 51/5012* (2013.01); *H01L 51/5048* (2013.01); *H01L 51/5056* (2013.01); *Y10T 428/1055* (2015.01)

(58) Field of Classification Search

CPC ............. H01L 51/0069; H01L 51/0074; H01L 51/0073; H01L 51/0072; H01L 51/0071; H01L 51/5056; H01L 51/5048; H01L 51/5012; H01L 51/0032; H01L 27/32; H01L 51/0012; C08G 61/126; C08G 2261/95; C08G 2261/144; C08G 2261/228; C08G 2261/312; C08G 2261/3223; C08G 2261/3242; C08G 2261/512; C08G 2261/522; C08G 2261/53; C08G 2261/124; C09K 19/584; C09K 19/582; C09K 19/56; C09K 19/58; C09K 19/00; C09K 11/00; B32B 2457/206; Y10T 428/1055; G02F 1/133788

See application file for complete search history.

(56) References Cited

U.S. PATENT DOCUMENTS

| | | | | |
|---|---|---|---|---|
| 5,834,100 | A | 11/1998 | Marks et al. | |
| 6,054,190 | A | 4/2000 | Ogawa et al. | |
| 6,156,232 | A * | 12/2000 | Shashidhar | C03C 17/30 252/299.4 |
| 9,508,942 | B2 * | 11/2016 | Koch | H01L 51/0059 |
| 2003/0021913 | A1 * | 1/2003 | O'Neill | C09K 19/34 428/1.21 |
| 2003/0099785 | A1 | 5/2003 | O'Neill et al. | |
| 2003/0104145 | A1 | 6/2003 | Ogawa et al. | |
| 2005/0040396 | A1 | 2/2005 | O'Neill et al. | |
| 2005/0082525 | A1 * | 4/2005 | Heeney | C07D 495/04 257/40 |
| 2005/0116199 | A1 | 6/2005 | Kelly et al. | |
| 2005/0136288 | A1 * | 6/2005 | Lee | H01L 51/0035 428/690 |
| 2005/0146263 | A1 | 7/2005 | Kelly et al. | |
| 2005/0147846 | A1 | 7/2005 | Marks et al. | |
| 2007/0134511 | A1 | 6/2007 | Kawamura et al. | |
| 2007/0195576 | A1 | 8/2007 | Sharp | |
| 2007/0264748 | A1 | 11/2007 | Sirringhaus et al. | |

FOREIGN PATENT DOCUMENTS

| | | | |
|---|---|---|---|
| EP | 1 394 188 | A1 | 3/2004 |
| EP | 1 598 387 | A1 | 11/2005 |
| JP | 2001166519 | | 6/2001 |
| JP | 2002040686 | | 2/2002 |
| JP | 2004212959 | | 7/2004 |
| JP | 2005206750 | | 8/2005 |
| WO | WO 97/49548 | A1 | 12/1997 |
| WO | WO 2004/041901 | A1 | 5/2004 |
| WO | WO 2004/093154 | A2 | 10/2004 |
| WO | WO 2005/001952 | A1 | 1/2005 |
| WO | WO 2005/034184 | A2 | 4/2005 |
| WO | WO 2005/095543 | A2 | 10/2005 |
| WO | WO 2005/121150 | A1 | 12/2005 |
| WO | WO 2006/058182 | A2 | 6/2006 |
| WO | WO 2006/058266 | A2 | 6/2006 |
| WO | WO 2006/058267 | A2 | 6/2006 |
| WO | WO 2006/060294 | A2 | 6/2006 |
| WO | WO 2006/131185 | A1 | 12/2006 |

OTHER PUBLICATIONS

Aldred et al., "Linearly Polarised Organic Light-Emitting Diodes (OLEDs): Synthesis and Characterisation of a Novel Hole-Transporting Photoalignment Copolymer," *Journal of Material Chemistry*, vol. 15, Jun. 2005, pp. 3208-3213.

Contoret et al., "The Photopolymerization and Cross-Linking of Electroluminescent Liquid Crystals Containing Methacrylate and Diene Photopolymerizable End Groups for Multilayer Organic Light-Emitting Diodes," *Chemistry Materials*, vol. 14, No. 4, Apr. 2002, pp. 1477-1487.

Decker et al., "Photoinitiated Radical Polymerization of Vinyl Ether-Maleate Systems," *Polymer*, vol. 38, No. 9, Apr. 1997, pp. 2229-2237.

Kohli et al., "Co-Polymerization of Maleinrides and Vinyl Ethers: A Structural Study," *Micromolecules*, vol. 321, No. 17, Aug. 1998, pp. 5681-5689.

Lee et al., "Novel Photo Alignment Polymer Layer Capable of Charge Transport," *Macromolecular Chemistry and Physics*, vol. 205, No. 16, Nov. 2004, pp. 2245-2251.

Loy et al., "Thermally Stable Hole-Transporting Materials Based Upon a Fluorene Core,"*Advanced Functional Materials*, vol. 12, No. 4, Apr. 2002, pp. 245-249.

Neilson et al "Synthesis and Properties of Perfluorocyclobutyl (PFCB) Polymers for Light Emission," *Polymer Preprints*, vol. 46, No. 2, 2005, pp. 653-654.

Vak et al., "Synthesis and Characterization of Spiro-Triphyenylamine Configures Polyfluorene Derivatives with Improved Hole Injection," *Macromolecules*, vol. 39, No. 19, 2006, pp. 6433-6439.

Yu et al., "Fluorene-Based Light-Emitting Polymers," *Chinese Journal of Polymer Science*, vol. 19, No. 6, Dec. 2001, pp. 603-613.

* cited by examiner

1200

1300

LIQUID CRYSTAL PHOTOALIGNMENT MATERIALS

CROSS REFERENCE TO RELATED APPLICATION

This application is a continuation of U.S. Ser. No. 12/918,129 filed on Oct. 8, 2010, which is the national stage entry of International Patent Application No. PCT/GB2009/000415 having a filing date of Feb. 16, 2009, which claims priority to and the benefit of Great Britain Patent No. 0802916.7 filed in the United Kingdom Property Office on Feb. 18, 2008, the entire contents of which are incorporated herein by reference.

This invention relates to materials and particularly to surface derivatising materials with combined charge transporting and liquid crystal photoalignment properties.

Organic light emitting diode devices with molecularly aligned liquid crystalline emitters and charge transporting layers are potentially useful for application as liquid crystal display backlights, 3-D displays, and other applications where production of polarised light by an OLED is desired. In addition molecularly aligned, photocrosslinkable, liquid crystalline emitters (reactive mesogens) can find use in organic DFB lasers and other luminescent devices where they may be patterned into nanostructures.

In order to produce light emitting devices and other electronic devices that utilise molecularly aligned reactive mesogens, it is necessary to include in the devices some alignment means that causes the liquid crystalline material to be uniformly aligned. In one proposal, photoalignment layers were used for this purpose. These are layers of material that, when exposed to intense, polarised UV light, undergo a photochemical reaction that imparts to them a surface energy anisotropy. This results in the property that liquid crystals coated on to the surface of such a previously exposed material preferentially wet that surface with their molecular long axes aligned in a preferred direction generally either parallel to or perpendicular to the polarisation axis of the UV exposure light as it was projected onto the photoalignment layer surface. As a result the liquid crystal molecules are uniformly aligned in that preferred direction. This produced light emitting devices utilising liquid crystalline electroluminescent materials aligned in such a way and energised by passing an electric, current through them.

As shown in the example in FIG. 1 (Prior Art), to produce a working electroluminescent device 100 utilising this combination of photoalignment materials and liquid crystalline emitter materials it is necessary that the aligned liquid crystalline material 140 must be in intimate contact with the photoalignment layer 130. This farther means that an electric current must be able to be passed from the anode 110 through as hole injection layer 120, then through the photoalignment layer 130 so as pass into the emitter layer 140 energising it to produce light. Commercially available photoalignment layers that have been previously used in LCDs are not suitable for this application because they are insulating in nature and would not allow current to pass through them into the charge transporting and emitter materials in the electroluminescent device. This problem was solved by mixing, known charge transporting materials such as triarylamines into solutions of polymeric photoalignment materials. The photoalignment materials used were, for instance, polymethacrylic acid polymers esterified with alkenyl sidechains terminated with coumarin. If sufficient triarylamine is mixed into a solution of the normally electrically insulating, coumarin substituted polymethacrylic acid and this solution is solvent cast onto the surface of an anode, the material is found to be sufficiently hole conducting to pass current into a photopolymerised, light emitting reactive mesogen causing it to be energised to produce light. However, if too much of the triarylamine is doped into the photoalignment polymer, the photoalignment property is destroyed. Thus in developing these materials, there was a trade of between maximising the hole conduction of the mixture and maintaining its alignment properties. Whilst working devices could be produced that yielded polarised light emission from the aligned liquid crystalline material, the photoalignment material was less conductive than might be desired with the result that the operating voltage required to energise the devices was approximately 1.5 volts higher than for similar devices containing no photoalignment layer. This may result in poorer device performance and shortened lifetimes.

It was attempted to ameliorate this problem by devising new photoalignment materials in which the methacrylic acid polymer backbone was substituted with a mixture of side chains, some substituted with coumarin as previously and some substituted with a hole transporting material such as a 2,7-bis(5-phenylthien-2-yl)-9,9-dialkylfluorene. However, these new materials had much the same hole transporting and alignment properties as did the previously used mixtures.

Another issue with OLEDs in general has to do with hole injection layer 120 that is formed in OLEDs to facilitate injection of holes from the anode 110 into the organic material layers in the interior of the OLED. In polymer-based OLEDs the material that is quite often used to form this layer is polyethylene dioxythiophene polystyrene sulfonate (PEDT/PSS). This material is solvent cast from water onto the OLED anode material and then cured by heating. Subsequent OLED layers are then built up onto top of the PEDT/PSS layer. A problem with this polymer is that it is a strong acid and is believed to corrode the indium-tin oxide (ITO) anodes on which it is coated over time. Further, work has shown that there is a strong surface energy mismatch between PEDT/PSS and ITO. This leads to poor adhesion between these two adjacent layers. New hole injection layers have been devised based on surface derivatising hole transport materials that eliminate these problems. In this approach the triarylamines or other hole transporting materials that have been used to produce OLEDs are substituted with trichlorosilyl groups. An example is tris[4-(trichlorosilyl)phenyl]amine as shown in FIG. 2 (Prior Art). When a dilute toluene solution of this material is applied to the surface of an indium-tin oxide anode in the presence of atmospheric moisture the trichlorosilyl substituents are hydrolyzed to highly reactive trihydroxysilyl groups that in turn react with the ITO surface through In—O—Si and Sn—O—Si bonds. This reaction forms a monolayer of the triphenylamino groups at the ITO surface. After curing the film by heating the monolayer structure can be represented by the drawing in FIG. 3 (Prior Art). The cycle of applying the toluene solution and heat curing can be repeated multiple times to build up multiple molecular layers of the hole transporting material. FIG. 4 (Prior Art) represents the sort of structure, that can be built up from three application and cure cycles. The resulting hole injection structure supports, higher hole currents for the same applied voltage than do hole injection layers fabricated from PEDT/PSS.

The present invention provides improved surface derivatising materials with combined charge transporting and liquid crystal photoalignment properties.

The invention comprises a charge transporting, liquid crystal photoalignment material comprising a charge-transporting moiety connected through covalent chemical bonds to a surface derivatising moiety, and a photoalignment moiety connected through covalent chemical bonds to a surface derivatising moiety.

The invention also comprises a method for forming charge transporting, liquid crystal photoalignment layer comprising the immersion of a glass or similar substrate into a solvent solution of material comprising a charge transporting moiety connected through covalent chemical bonds to surface derivatising moiety and a liquid crystal photoalignment moiety connected through covalent chemical bonds to a surface derivatising moiety and then withdrawing and drying said substrate.

The invention also comprises a charge transporting liquid crystal photoalignment layer produced by such a method.

The invention also comprises an electronic device incorporating such a layer.

The invention also comprises a light emitting polymer layer formulated by first forming a charge transporting liquid crystal photoalignment layer by a method aforesaid, then coating a layer of a luminescent reactive mesogen material onto the liquid crystal photoalignment layer, then crosslinking the luminescent reactive mesogen.

The invention also comprises an electronic device that comprises a charge transporting layer or a light emitting polymer layer as aforesaid.

The invention also comprises a light emitting diode that comprises a light emitting polymer layer as aforesaid.

Examples of surface derivatising materials of the invention that are intended to be used to form hole transporting photoalignment layers of this type are portrayed in FIGS. 5-9. In the molecules in these figures chemical functional units that fulfill the hole transporting role are labelled "A", chemical functional units that fulfill the photoalignment role are labelled "B", and surface derivatising functional units are labelled "C". The hole transporting functional units (A) utilized in these examples include one or more functional sub-units that are chosen from a set including thieno[3,2-b]thiophene, dithieno[3,2-b:2',3'-d]thiophene, thieno[3,2-d]thieno[3,2-b:4,5-b']dithiophene, 2,2'-bithiophene, 2,2':5',2"-terthiophene, 2,2':5',2":5",2'"quaterthiophene, benzo[1,2-b:4,5-b]dithiophene, benzo[1,2-b:3,4-b':5,6-b"]trithiophene, naphthol[2,3-b:6,7-b']dithiophene, benzo[4,5]thieno[3,2-d]benzo[b]thiophene, triphenylamine, 1,4-bis(diphenylamino)benzene, 1,3,5-tris(diphenylamino)benzene, 4,4'-bis(diphenylamino)biphenyl, N,N-diphenyl-N-naphth-1-ylamine, N-phenyl-N,N-dinaphth-1-ylamine, trinaphth-1-ylamine, thiazolo[4,5-d]thiazole, 2,2'-bithiazole, 2,2':5',2"-terthiazole, N,N,N-tris(benzo[b]thiophene-5-yl)amine, thiazolo[4,5-b]thiophene, N,N,N-tris(benzo[d]thiazole-5-yl)amine, or other thiophene containing sub-units, triarylamine containing sub-units, thiazole containing sub-units, or sub-units that combine more than one of these three functionalities.

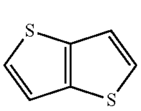

thieno[3,2-b]thiophene

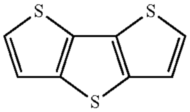

dithieno[3,2-b:2′, 3′-d]thiophene

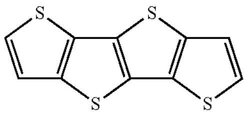

thieno[3,2-d]thieno[3,2-b:4,5-b′]dithiophene

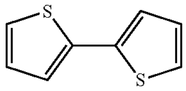

2,2′-bithiophene

-continued

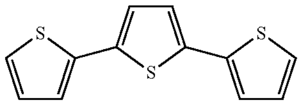

2,2′:5′, 2″-terthiophene

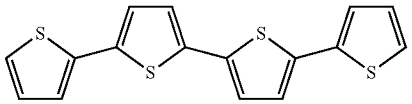

2,2′:5′, 2″:5″, 2 quarterthiophene

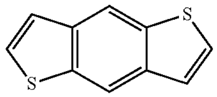

benzo[1,2-b:4,5-b′]dithiophene

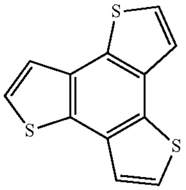

benzo[1,2-b:3,4-b′:5,6-b″]thrithiophene

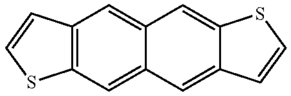

naphtho[2,3-b:6,7-b′]dithiophene

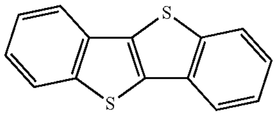

benzo[4,5]thieno[3,2-d]benzo[b]thiophene

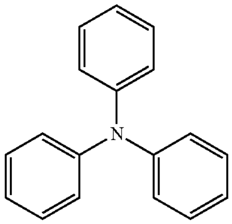

triphenylamine

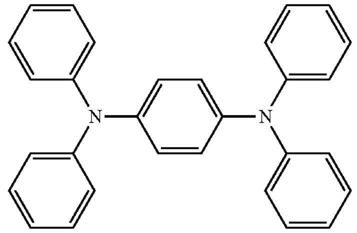

1,4-bis(diphenylamino)benzene

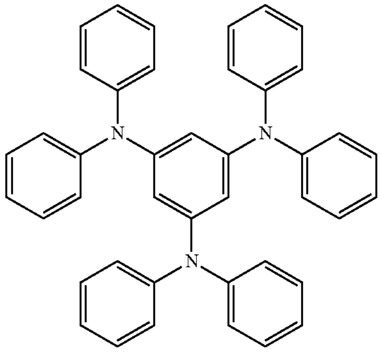

1,3,5-tris(diphenylamino)benzene

-continued

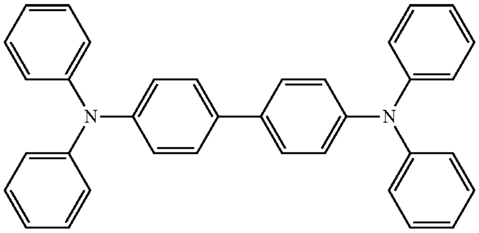

4,4′-bis(biphenylamino)diphenyl

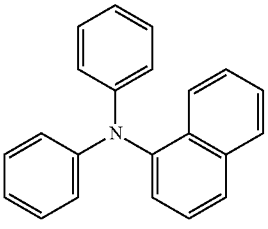

N,N-diphenyl-N-naphth-1-ylamine

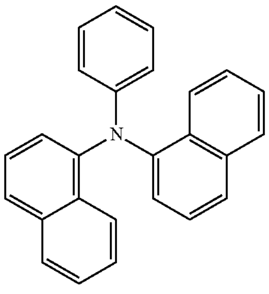

N-phenyl-N,N-dinaphth-1-ylamine

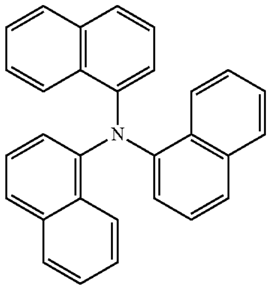

trinaphth-1-ylamine

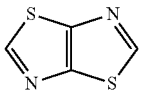

thiazolo[4,5-d] thiazole

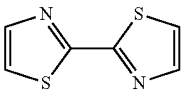

2,2′-bithiazole

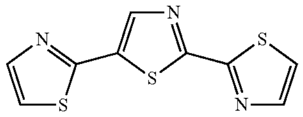

2,2′:5′,2″-terthiazole

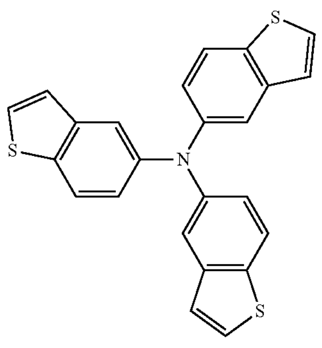

N,N,N-tris(benzo[b]thiophene-5-yl)amine

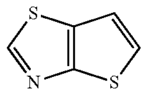

thiazolo[4,5-b] thiophene

-continued

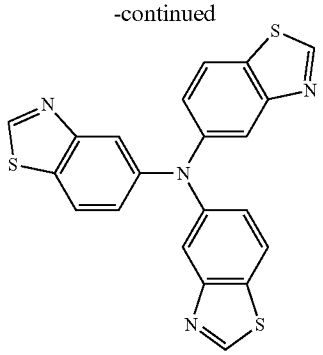

N,N,N-tris(benzo[b]thiazole-5-yl)amine

The photoalignment functional units (B) utilized in these examples include one or more functional sub-units that are chosen from a set including cinnamate esters, coumarins, quinolones (quinolin-2-ones), and thiocoumarins (benzo[b] thiin-2-ones).

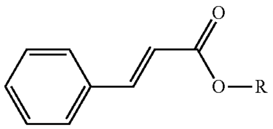

cinnamate ester

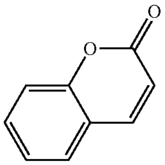

coumarin

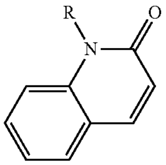

quinolin-2-one

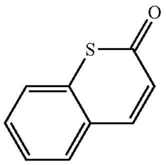

benzo[b]thiin-2-one

An example of a functional sub-unit that combines the hole transporting and photoalignment functionalities is the thieno[2'3':4,5]thieno[2,3-b]thiine-6-one functional sub-units found in the molecule in FIG. 9.

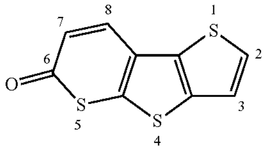

thieno[2′3′:4,5]thieno[2,3-b]thiin-6-one

Other similar sub-units with combined functionalities may be funned, for instance:

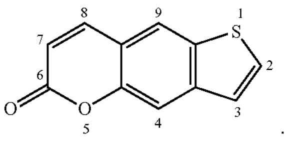

Thieno[2,3-g]chromen-6-one

These sub-units are similar to the thiocoumarin and coumarin ring systems in that they have similar α,β-unsaturated thiolactone and lactone six-membered rings fused to aromatic systems. In these cases the fused aromatic, ring systems are hole transporting in nature.

In the case of the material portrayed in FIG. 9, the two thieno[2'3':4,5]thieno[2,3-b]thiin-6-one functional sub-units are connected by a 1,4 phenylene nucleus to form combination hole transporting and photoalignment functional units within the material's molecules (labelled A&B, in the figure).

The surface derivatising functional units labelled "C" in FIGS. 5-9 may be chosen from a set including trihalosilanyl groups (especially trichlorosilanyl groups), trialkoxysilanyl groups (especially methoxy and ethoxy), and Werner complexes of transition metals. In particular if metal complexes are used, dinuelear carboxyl to complexes of transition metals of the type

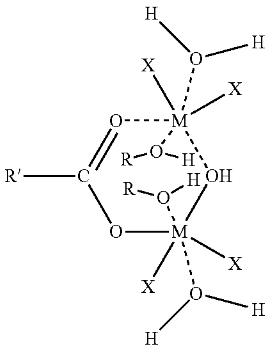

are preferred. Here R' represents the remainder of the inventive, surface derivatising, hole transporting, photoalignment material molecule; M represents a transition metal (preferably with oxidation state+3 and most preferably CrIII; X represents an anionic ligand chosen from halido (e.g., chlorido), pseudo halide (e.g., cyanido, cyanato, etc.) or an oxoacid derived anion (e.g. nitrato); and R represents an organic radical, preferably an alkyl radical and most preferably methyl or ethyl. The example shown in FIG. 7 utilises as surface derivatising functional units μ-carboxylato-μ-hydroxido-bis[aquadichloridoethanolchromium(III)] groups (R taken as ethyl).

It may be useful, in terms of sterically freeing the surface derivatising functional units to interact with substrate surfaces, or freeing photoalignment groups to assume random orientations, to introduce into the molecules of inventive materials flexible linkages between one or another of the hole transporting or photoalignment or surface derivatising functional units. For instance, in the example shown in FIG. 7 the coumarin-containing photoalignment functional units (B) are linked with the hole transporting nucleus of the molecules through flexible trimethylene linkages. In the molecule portrayed in FIG. 5 the photoaligning cinnamate functional units are connected to the hole transporting molecular nucleus through flexible ethylene linkages while the surface derivatising trichlorosilyl groups are connected to the same nucleus through flexible hexamethylene linkages.

A further embodiment of the invention consists of surface derivatising materials that are intended to be used to form electron transporting photoalignment layers. All example of this type of material is shown in FIG. 10. These materials differ from the hole transporting materials exemplified by the structures in FIG. 5-9 in that the molecular functional units labelled "A" are electron transporting rather than hole transporting. The electron transporting functional units may be built of from a set of sub-units including, selected independently from, but not limited to, aryl 1,2,4-triazoles (especially triaryl 1,2,4-triazoles), 1,3-oxazoles, 2,2'-bi-1,3-oxazoles, 1,2,4-oxadiazoles, 3,3'-bi-1,2,4-oxadiazoles, imidazo[4,5-d]-imidazoles, benzo[1,2-d:4,5-d']dioxazoles, benzo[1,2-d2,3-d':4,5-d"]trioxazoles, bathocuproines, and bathophenanthrolines.

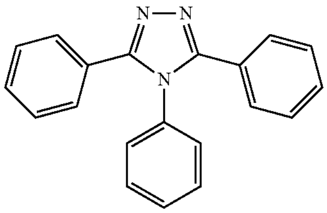

triphenyl 1,2,4-triazole

1,3-oxazole

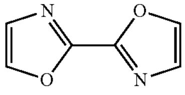

2,2′-bi-1,3-oxazole

1,2,4-oxadiazole

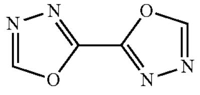

3,3′-bi-1,2,4-oxadiazole

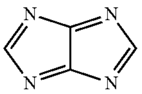

imidazo[4,5-d]-imidazole

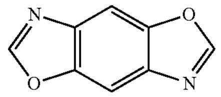

benzo[1,2-d:4,5-d′] dioxazole

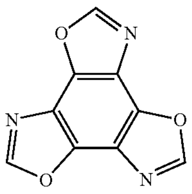

benzo[1,2-d:2,3-d′:4,5-d″]-trioxazole

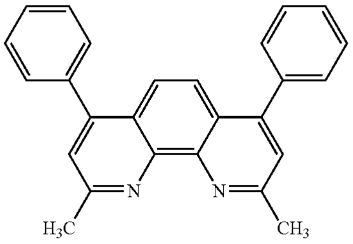

bathocuproine

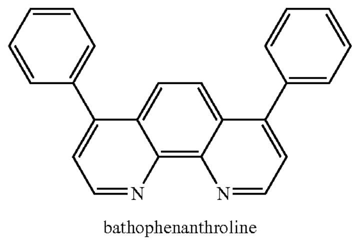

bathophenanthroline

The photoalignment functional units "B" used in the molecules of this embodiment are the same as those that are used in the hole-transporting embodiment.

The surface derivatising functional units used in this embodiment are of necessity different from those used in the hole-transporting embodiment. Since the electron transporting, photoalignment materials must surface derivatise an active metal cathode the chemistry involved is different. The surface derivatising functional groups of this embodiment may be chosen from a set including, but not limited to, alkali metal and alkaline earth metal enolate salts of 1,3-dialkyl substituted pentane-1,3-diones (preferably calcium salts) and alkali metal salts of dialkylamines that are chemically bonded to the electron transporting and photoalignment functional units of the molecules of the embodiment materials, trihalosilyl groups, and trialkoxysilyl groups.

A further embodiment of the invention consists of a process for forming hole transporting or electron transporting photoalignment layers formed by contacting device substrates with solutions containing materials whose molecules comprise at least one or more of each of a charge transporting functional unit, a photoalignment functional unit, surface derivatising functional unit. These layers may be formed by one or more cycles of applying said solutions and heat curing said solutions. Preferred hole transporting or electron transporting functional layers may be harmed carrying out between 3 and 7 application and cure cycles. The structure of the photoalignment layer formed by two application and cure cycles of the material in FIG. 5 is shown in FIG. 11.

Yet a further embodiment of the patent consists of forming a hole transporting or electron transporting photoalignment layer by contacting device substrates with solutions containing a mixture of at least two materials at least one of which is a first material that comprises molecules containing at least one or more of each of a charge transporting functional unit and a surface derivatising functional unit, and at least one of which is a second material that comprises molecules containing at least one or more of each of a liquid crystal photoalignment functional unit and a surface derivatising functional unit.

An example of a hole transporting photoalignment layer formed from such a mixture is the following. A solution of 0.8 grams/liter of compound 1200 (FIG. 12) and 1.6 grams/liter of compound 1300 (FIG. 13) in toluene is puddled onto the surface of an indium-tin oxide OLED anode for two minutes. The device is then spun at 2500 rpm, rinsed with toluene to remove excess material, and then cured at 90° C. for one hour. This deposition and thermal cure cycle is repeated three more times. The coated part is rinsed in deionised water for 15 minutes to remove ionic impurities. And then dried at 120° C. in a vacuum oven for 15 minutes. The resultant alignment film coated substrates are then exposed to polarized 325 nm. wavelength radiation from HeCd laser to induce the anisotropic surface energy required for liquid crystal alignment. After this exposure the films are ready to be overcoated with reactive mesogen emitter or reactive mesogen charge transporting material. After the coated reactive mesogen is annealed above its nematic to isotropic transition temperature and cooled it will be uniformly aligned by the underlying photoalignment material.

A farther improvement on the mixture-based charge transporting layers consists of changing the ratio of the number of photoalignment functional units to charge transporting functional units within the photoalignment material film from one monomolecular layer to the next. As an example, using the material deposition technique outlined in the preceding paragraph a first mono-molecular layer is deposited using a solution of 2.4 grams/liter of material 1200 in toluene. Next mono-molecular layers are deposited from a solution 1.8 grams/liter of material 1200 and 0.6 grams/liter of material 1300 in toluene. Finally a fourth mono-molecular layer is deposited from a solution of 0.6 grams/liter of material 1200 and 1.8 grams/liter of material 1300 in toluene. A bole transporting photoalignment layer of this type with a varying concentration photoalignment functional unit from one mono-molecular layer to the next may be used advantageously to maximize hole transporting characteristics while maintaining good liquid crystal alignment.

In these examples the molecules of the first, hole transporting, material may be chosen from a group of materials whose molecules combine one or more hole transporting functional units with one or more surface derivatising functional units. In turn, the hole transporting functional units comprise one or more functional sub-units that are chosen from a set including:

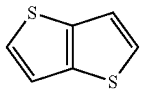

thieno[3,2-b]thiophene

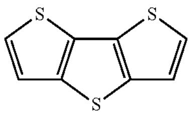

dithieno[3,2-b:2′, 3′-d] thiophene

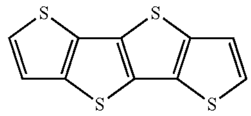

thieno[3,2-d]thieno [3,2-b:4,5-b′]dithiophene

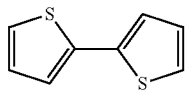

2,2′-bithiophene

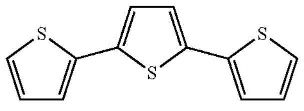

2,2′:5′, 2″-terthiophene

thiophene

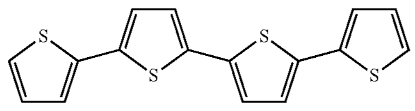

2,2′:5′, 2″:5″, 2 quarterthiophene

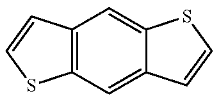

benzo[1,2-b:4,5-b′]dithiophene

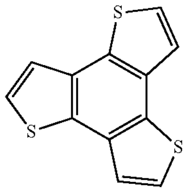

benzo[1,2-b:3,4-b′:5,6-b″] thrithiophene

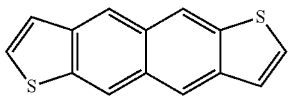

naphtho[2,3-b:6,7-b′]dithiophene

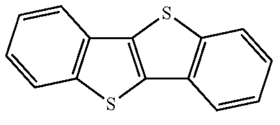

benzo[4,5]thieno[3,2-d] benzo[b]thiophene

thiazole

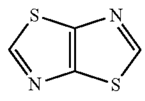

thiazolo[4,5-d] thiazole

-continued

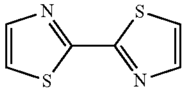

2,2′-bithiazole

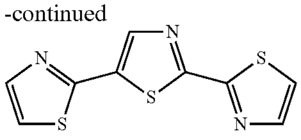

2,2′:5′,2″-terthiazole

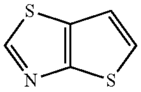

thiazolo[4,5-b] thiophene or triarylamines as was the ease in the work described in U.S. Pat. No. 5,834,100.

The photoalignment functional units utilized in the second materials include one or more functional sub-units that are chosen from a set including cinnamate esters, coumarins, quinolones (quinolin-2-ones), and thiocoumarins (benzo[b] thiin-2-ones).

The surface derivatising functional units in both the first and second materials may be chosen from a set including trihalosilanyl groups (especially trichlorosilanyl groups), trialkoxysilanyl groups (especially methoxy and ethoxy), and Werner complexes of transition metals. In particular if metal complexes are used, dinuclear carboxylato complexes of transition metals of the type discussed above are preferred.

Further examples of the first, hole transporting, materials are shown in FIGS. 14-16. Further examples of the second, photoalignment, materials are shown in FIGS. 17-18.

BRIEF DESCRIPTION OF THE DRAWINGS

A full and enabling disclosure of the present disclosure is provided in the specification, including reference to the accompanying figures, in which.

Figure 1:
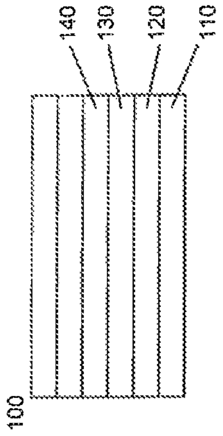
FIG. 1 illustrates a prior art electroluminescent device.
Figure 2:
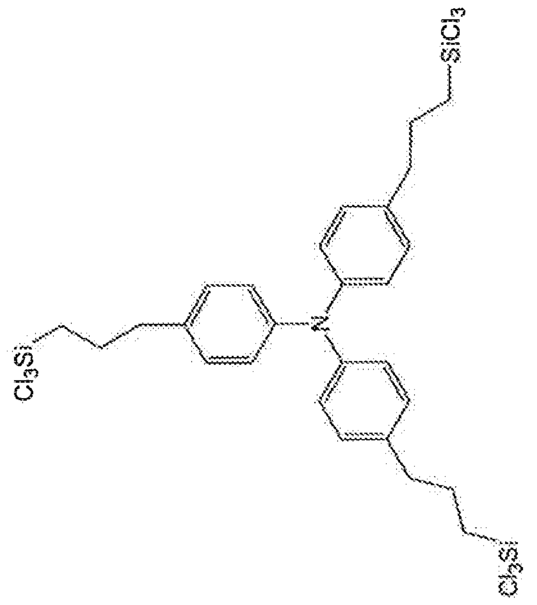
FIG. 2 illustrates the structure of tris[4-(trichlorosilyl) phenyl]amine.
Figure 3:
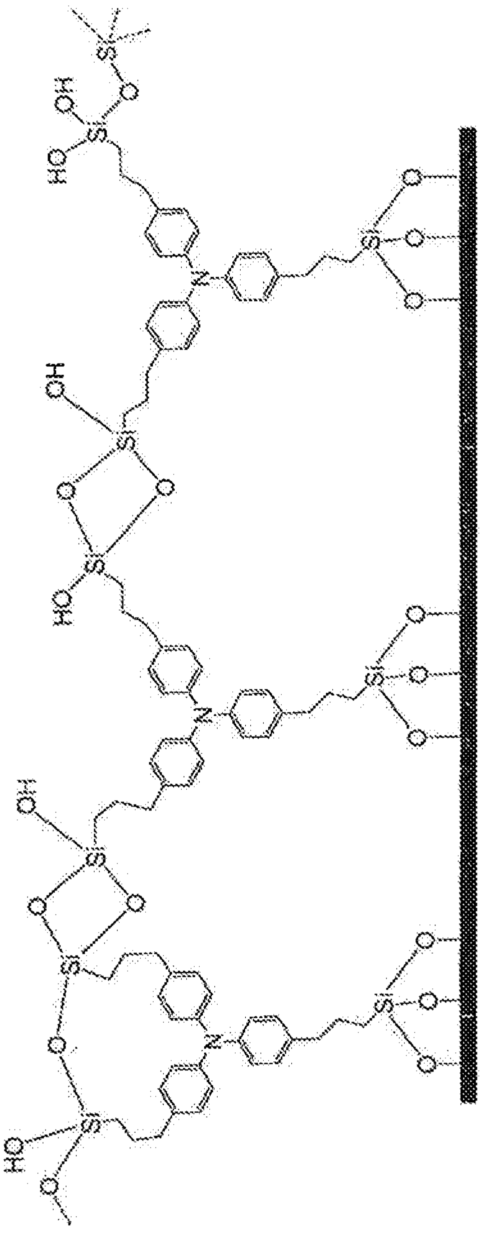
FIG. 3 illustrates monolayer structure on a substrate after curing.
Figure 4:
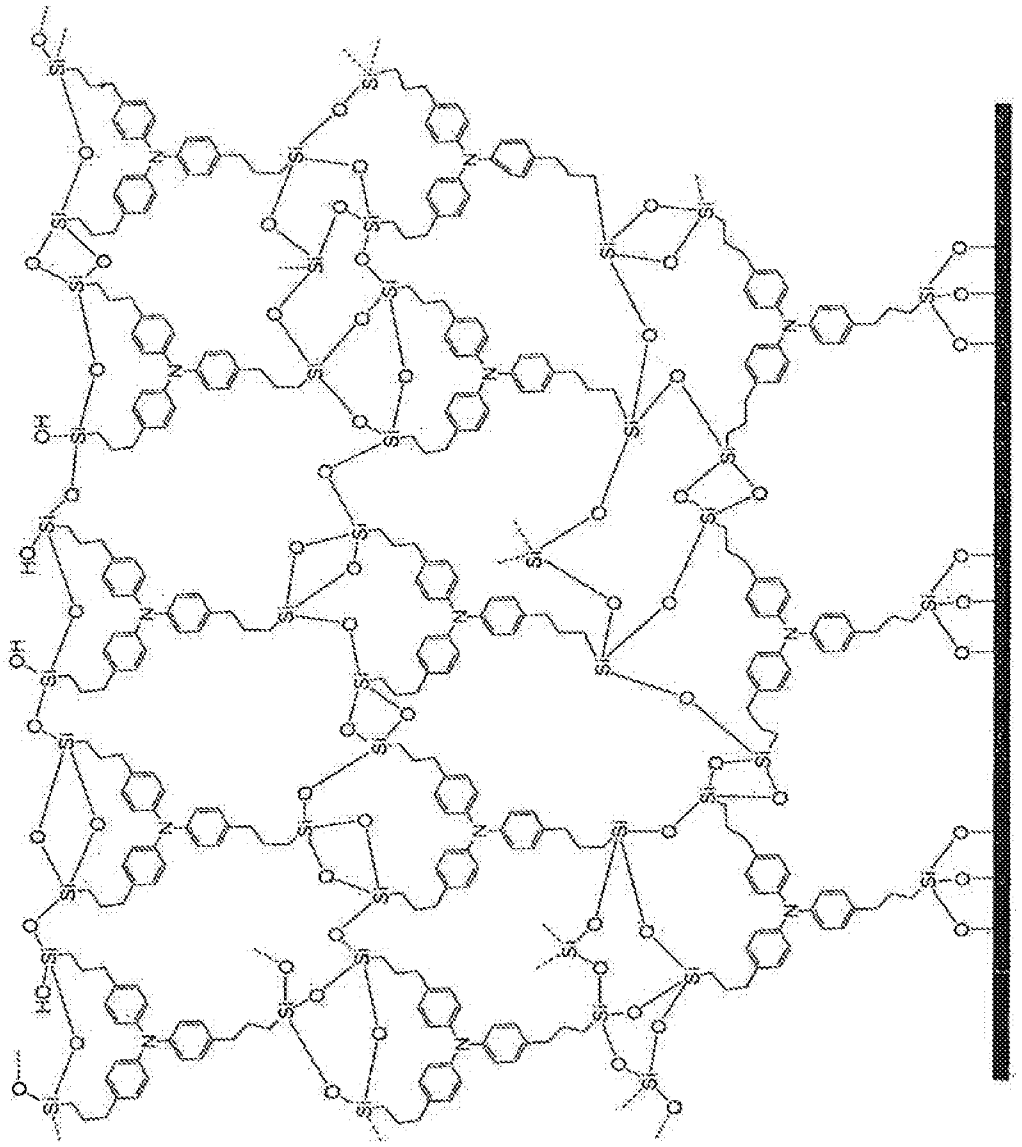
FIG. 4 illustrates a structure containing multiple molecular layers obtained after several cycles.
Figure 5:
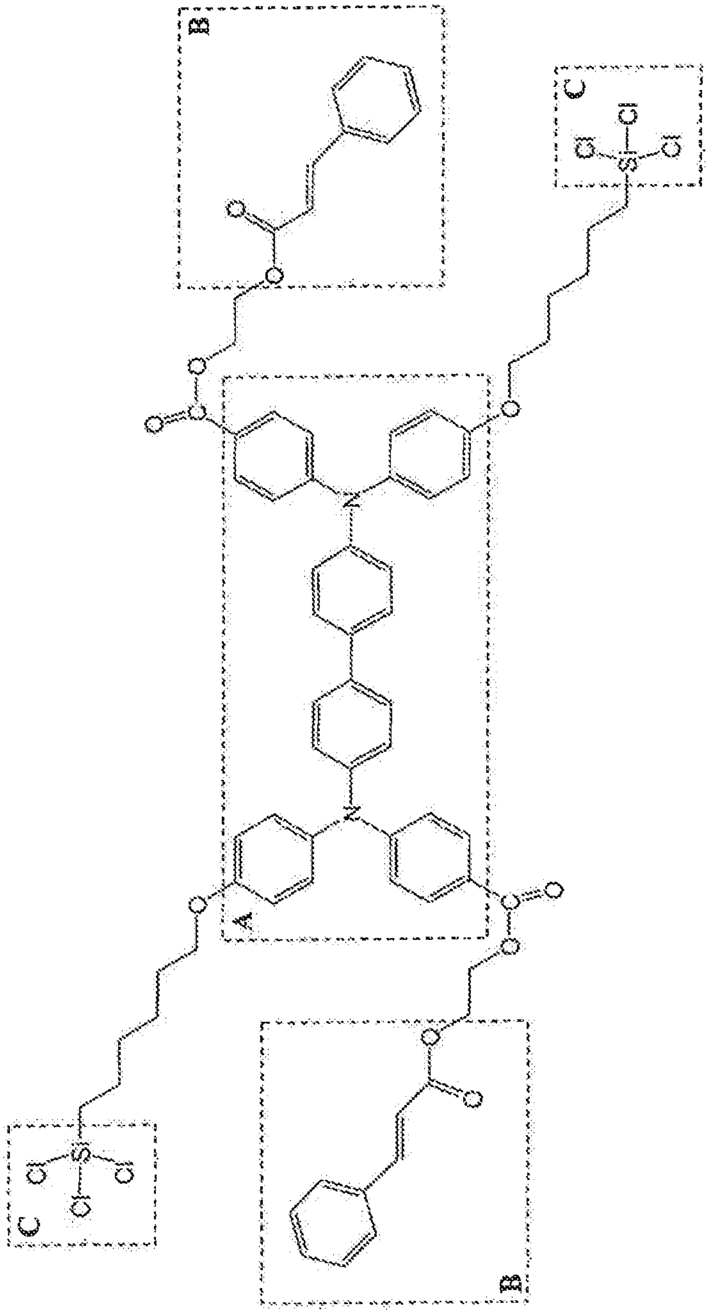
FIGS. 5-9 illustrate examples of surface derivatising, materials that can be used to form hole transporting photoalignment layers.
Figure 6:
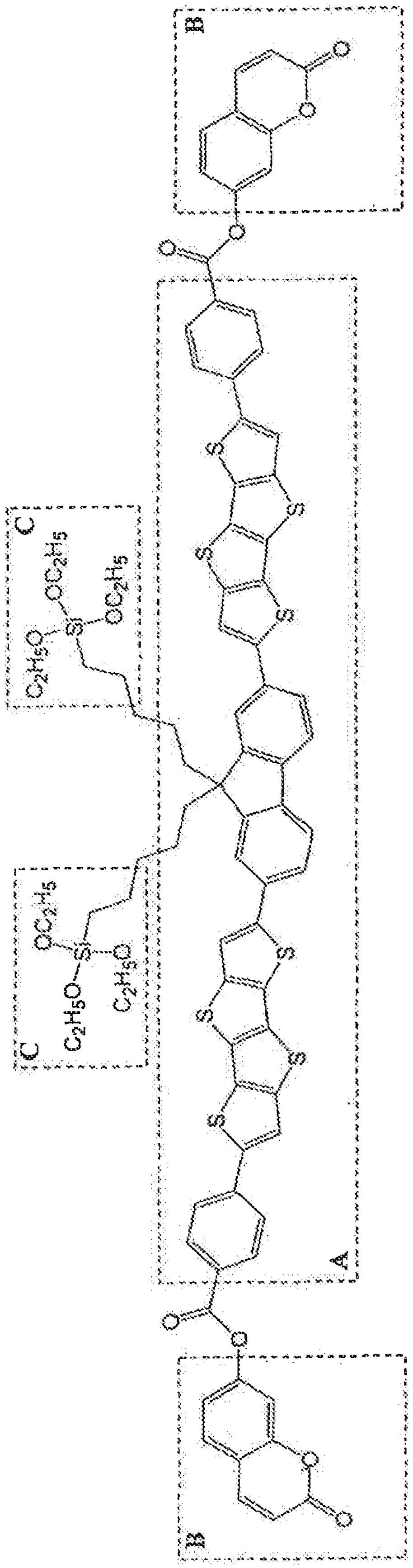
Figure 6A:
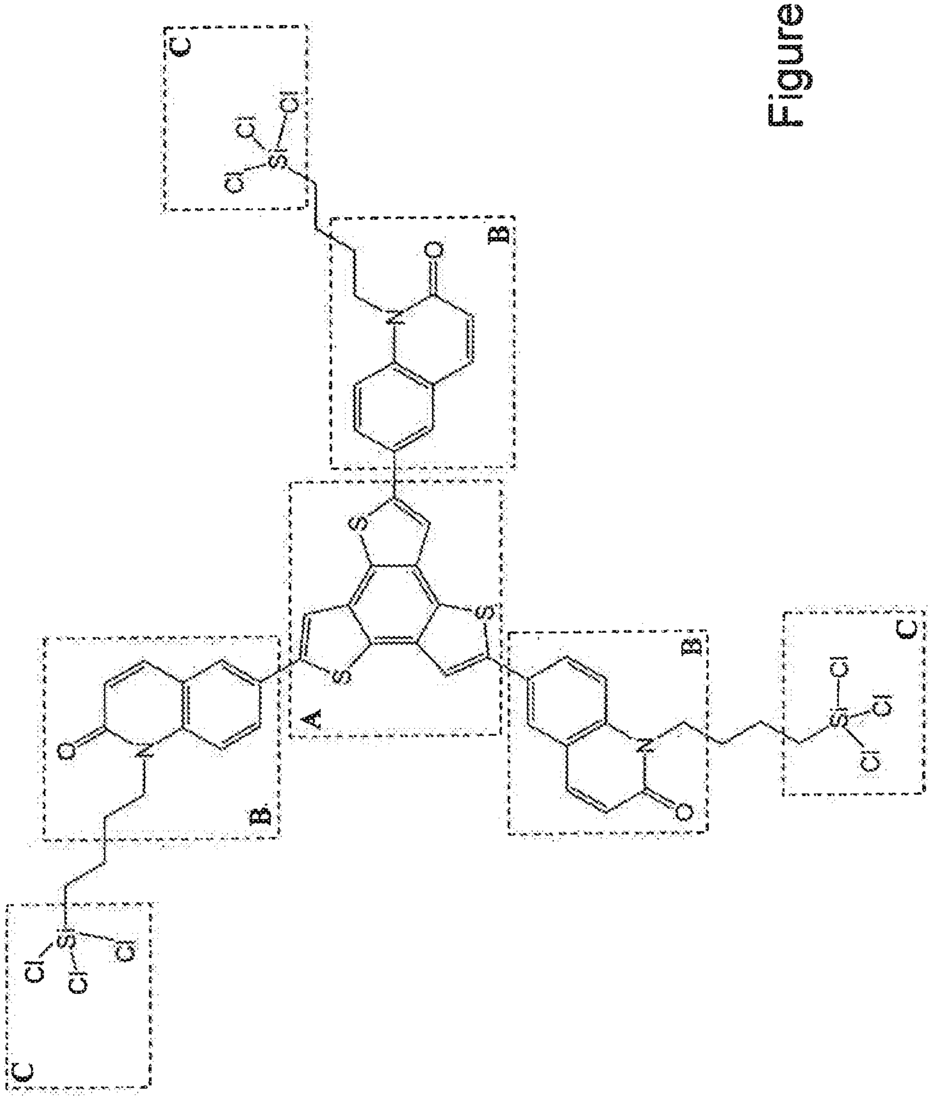
Figure 7:
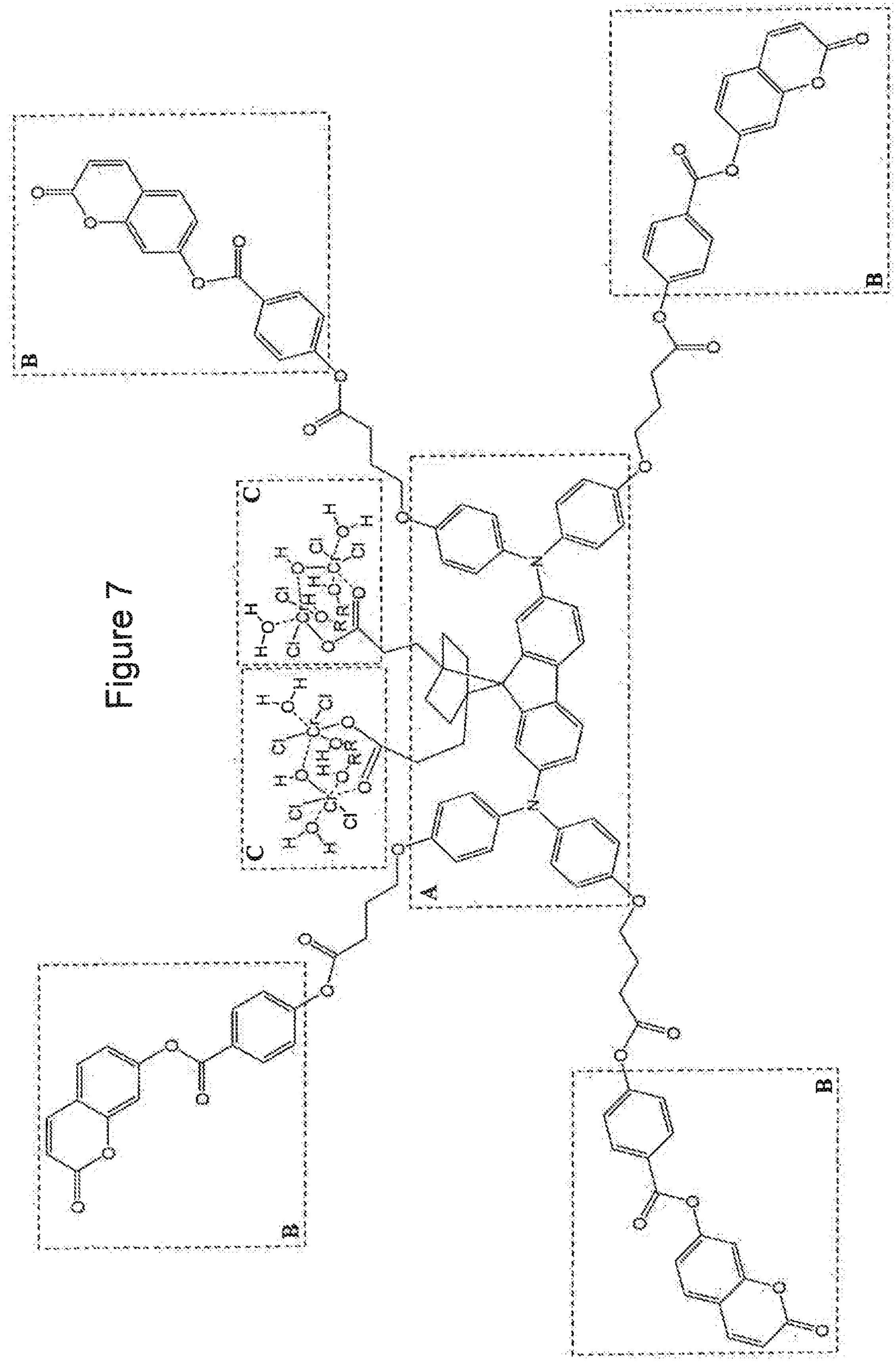
Figure 8:
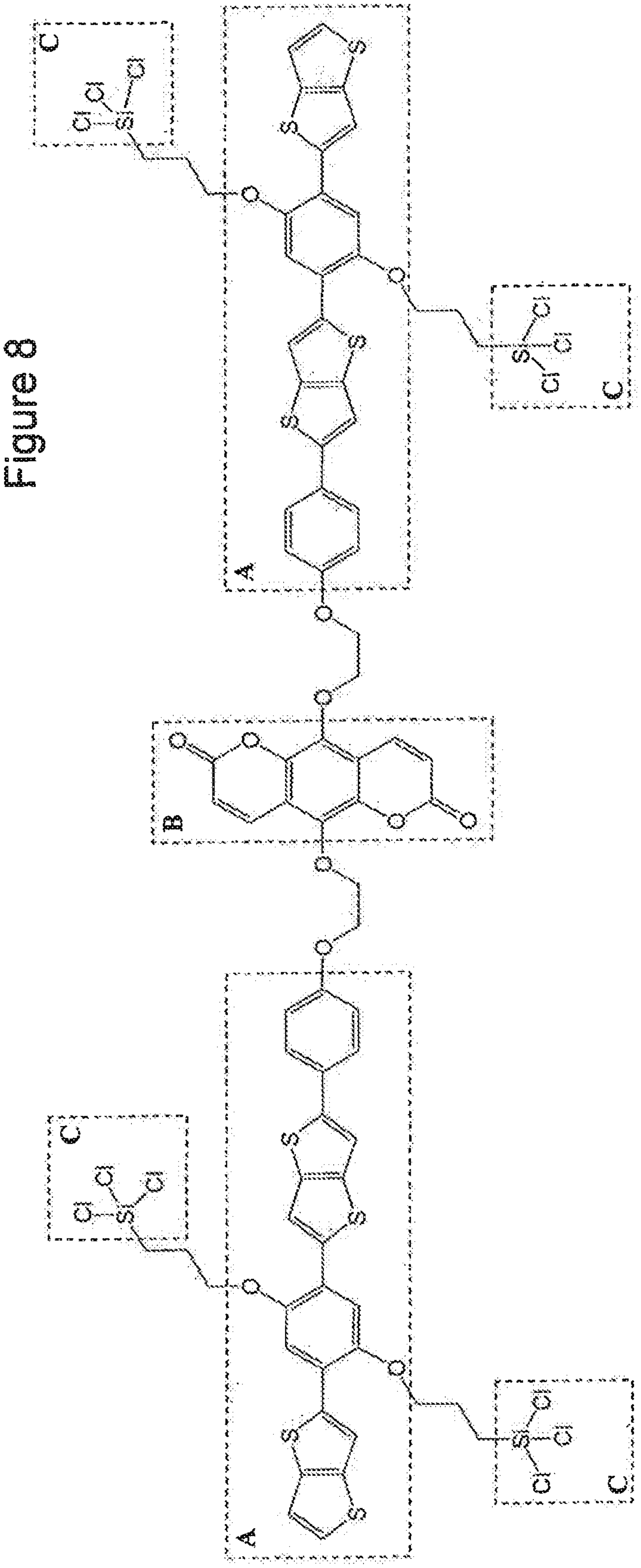
Figure 9:
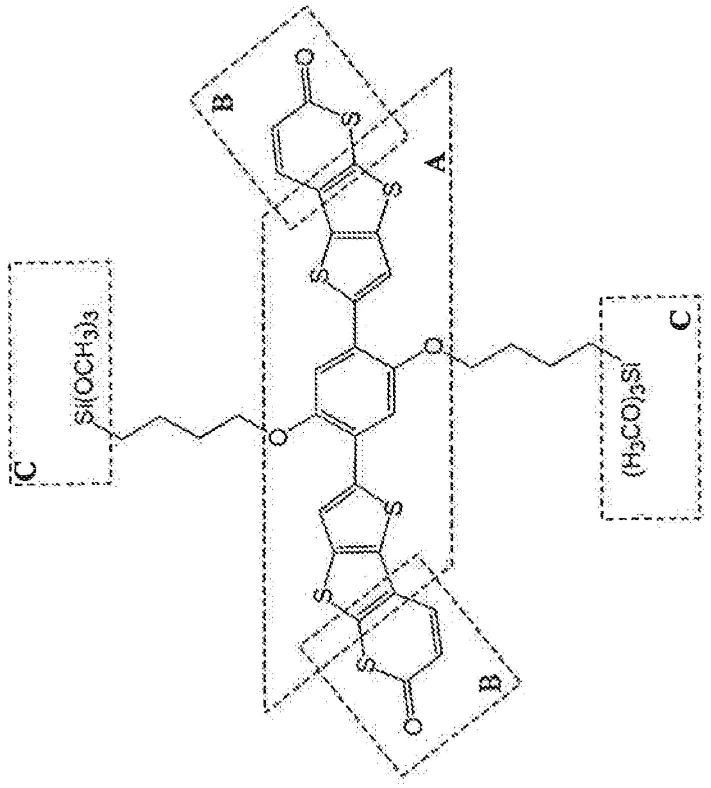
Figure 10:
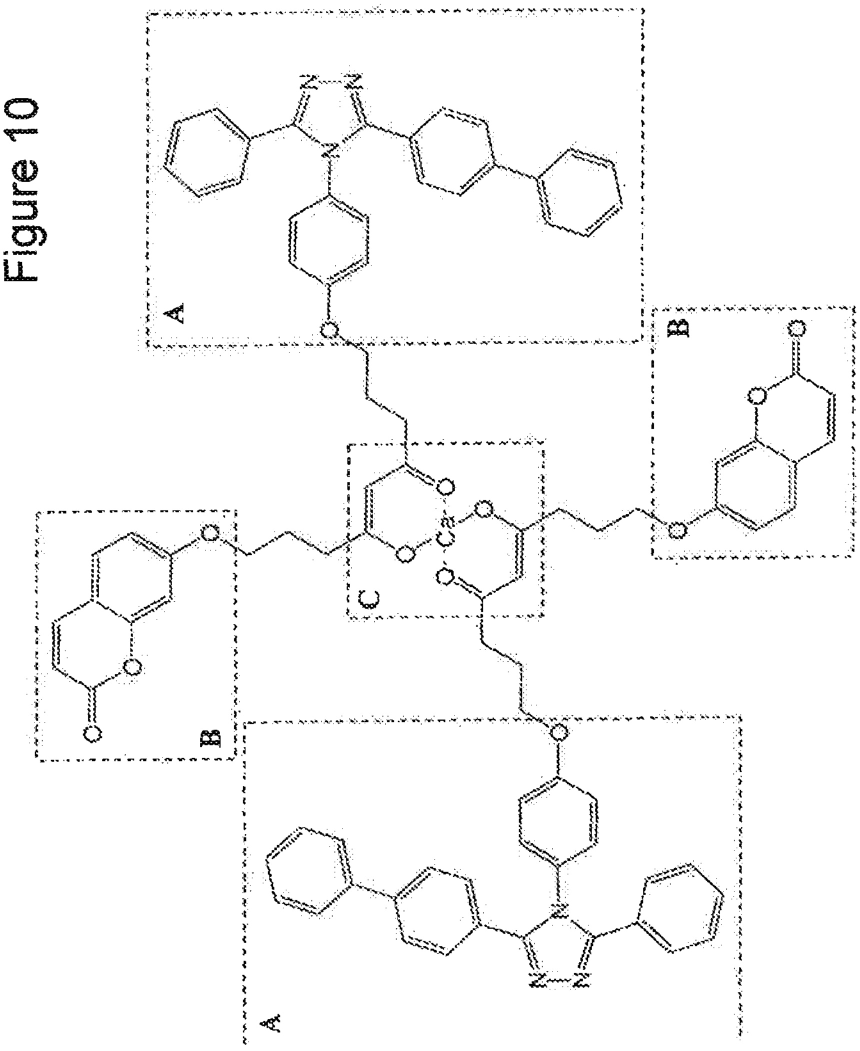
FIG. 10 illustrates an example of a surface derivatising, materials that can be used to form an electron transporting photoalignment layer.
Figure 11:
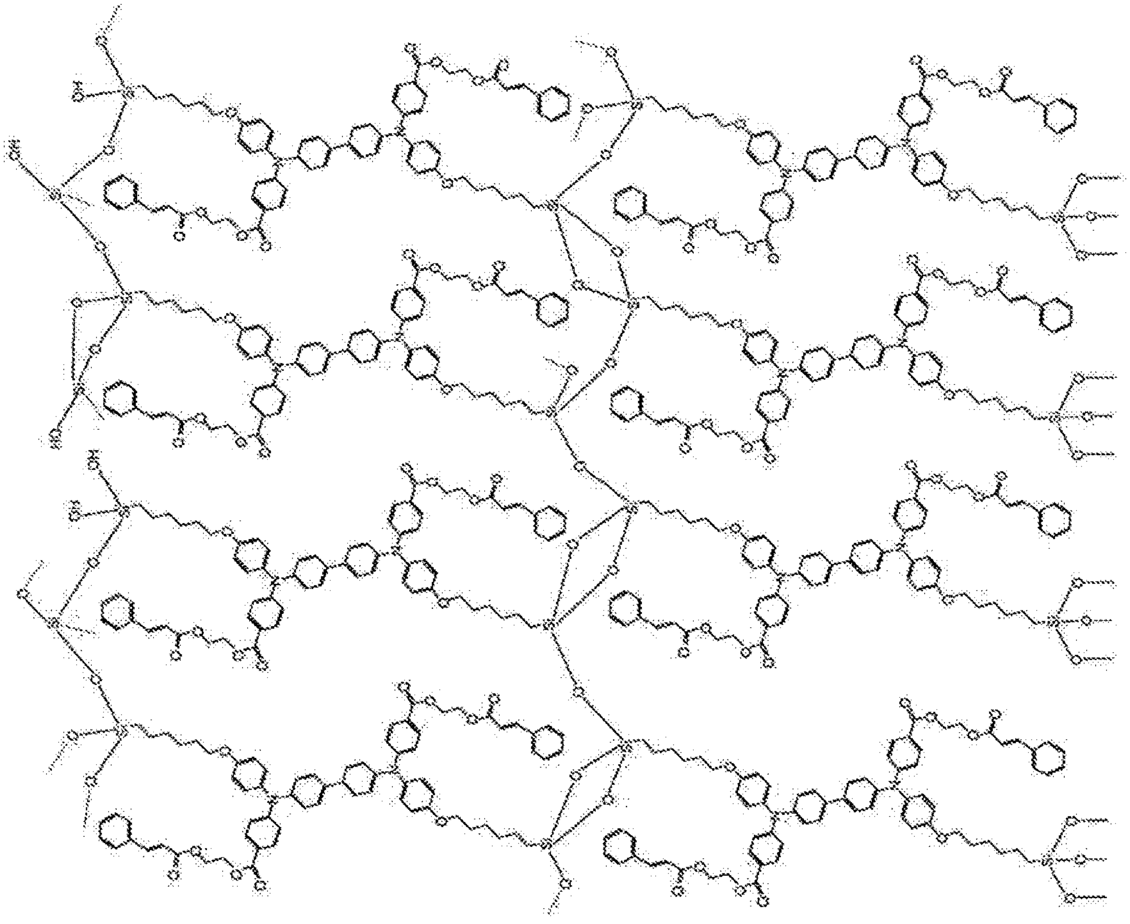
FIG. 11 illustrates the structures of the photoalignment layer formed by two application and cure cycles of the material of FIG. 5.
Figure 12:
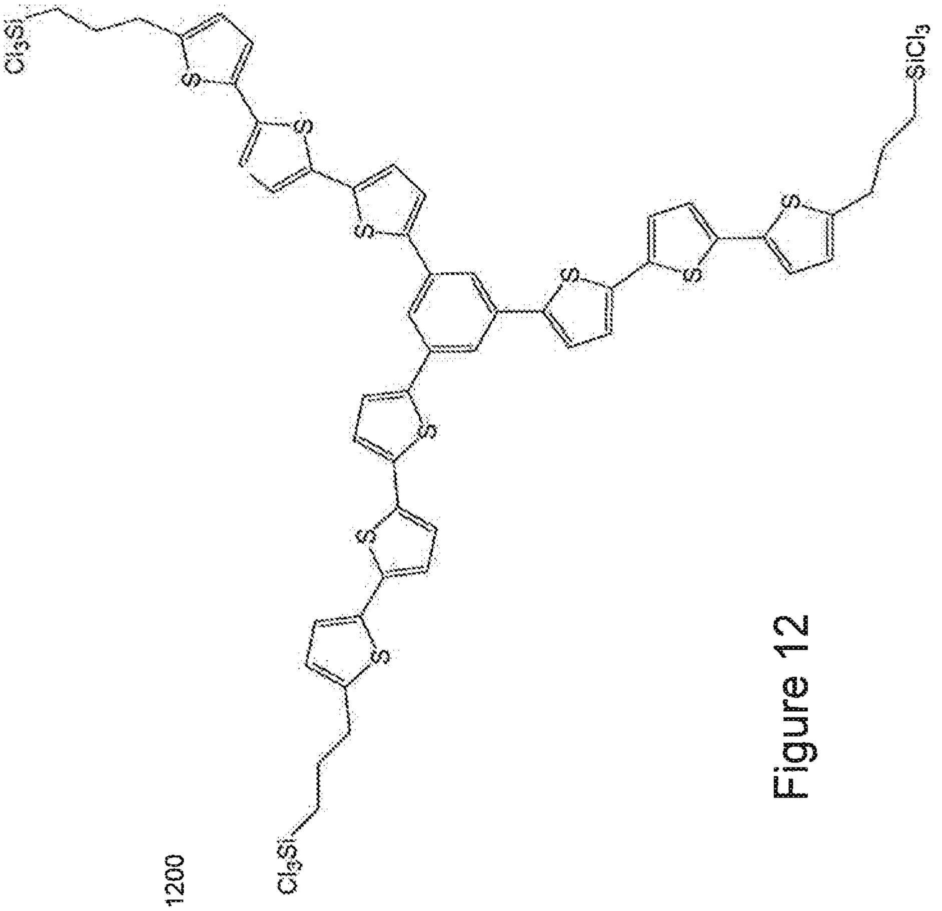
FIGS. 12 and 13 illustrate two compounds used to form a hole transporting photoalignment layer.
Figure 13:
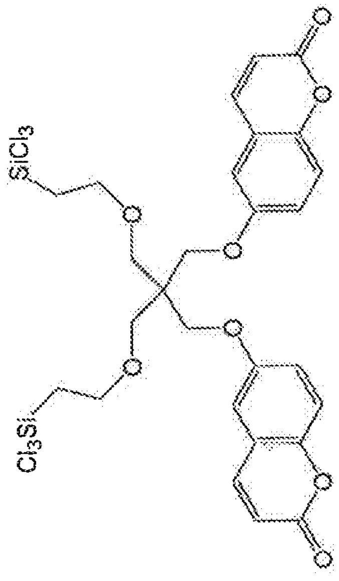
Figure 14:
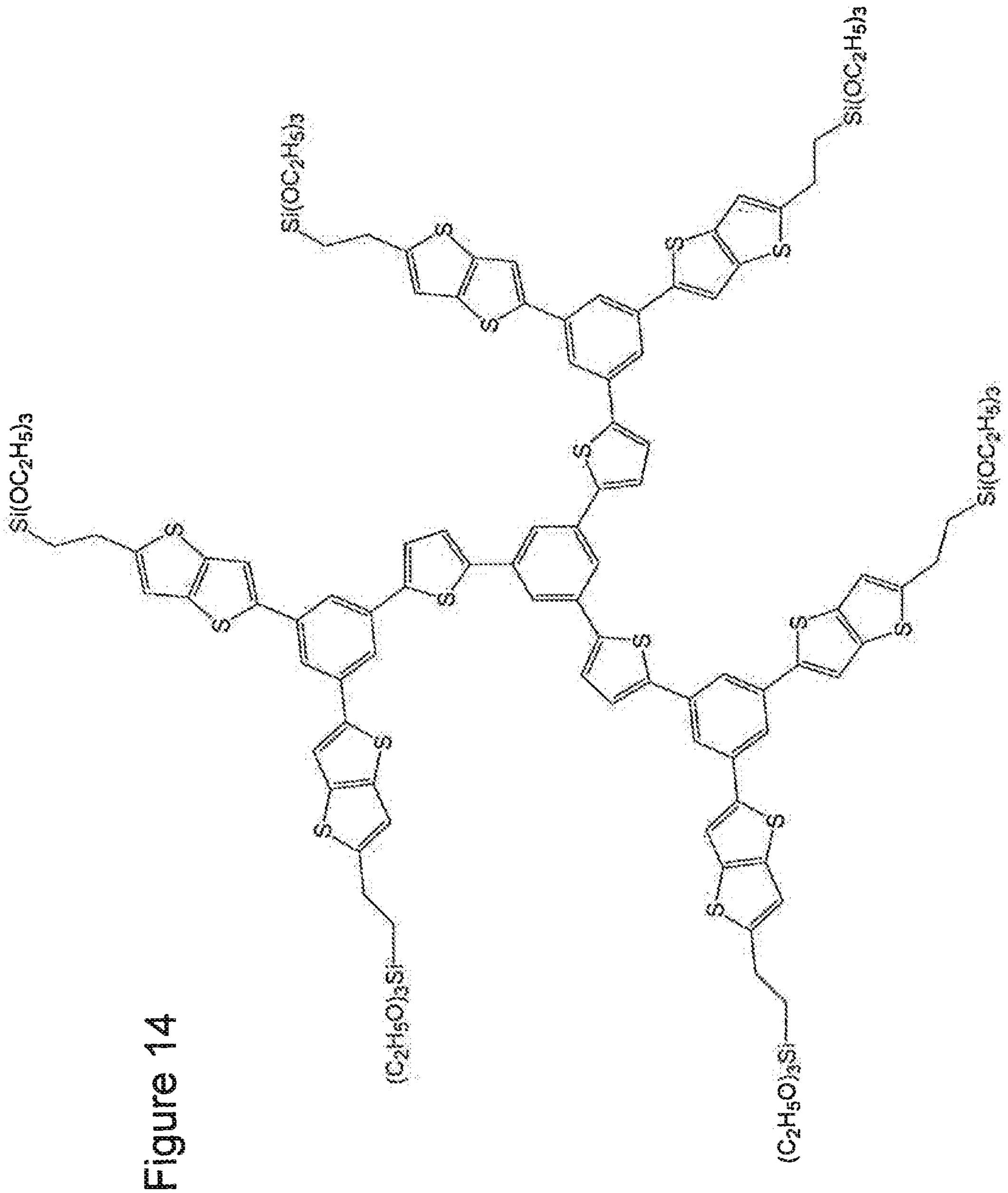
FIGS. 14-16 illustrate examples of hole transporting materials.
Figure 15:
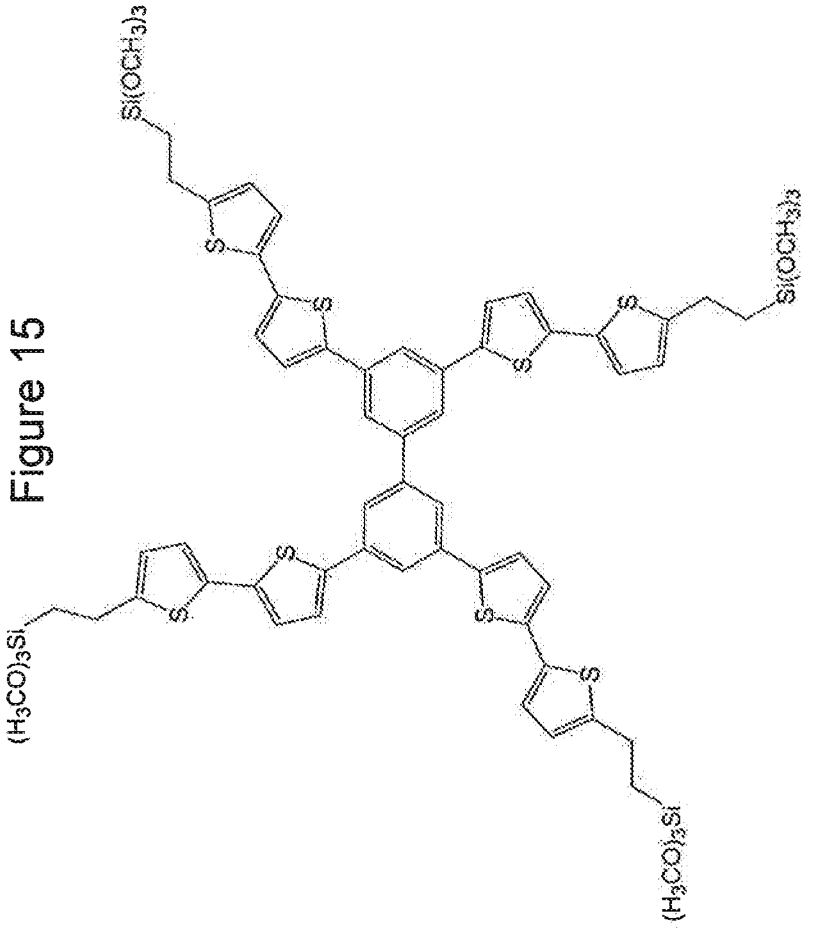
Figure 16:
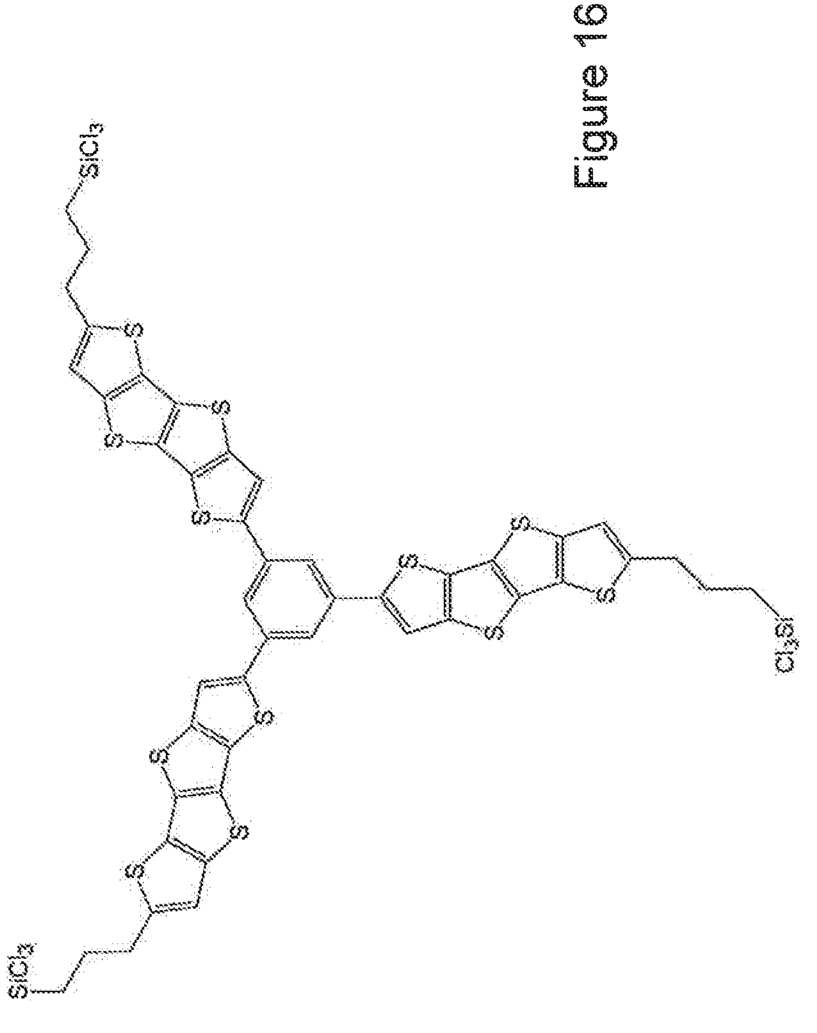
Figure 17:
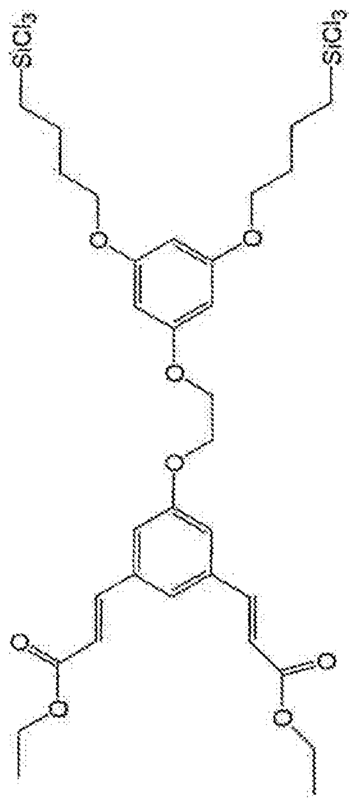
FIGS. 17-18 illustrate examples of photoalignment materials.
Figure 18:
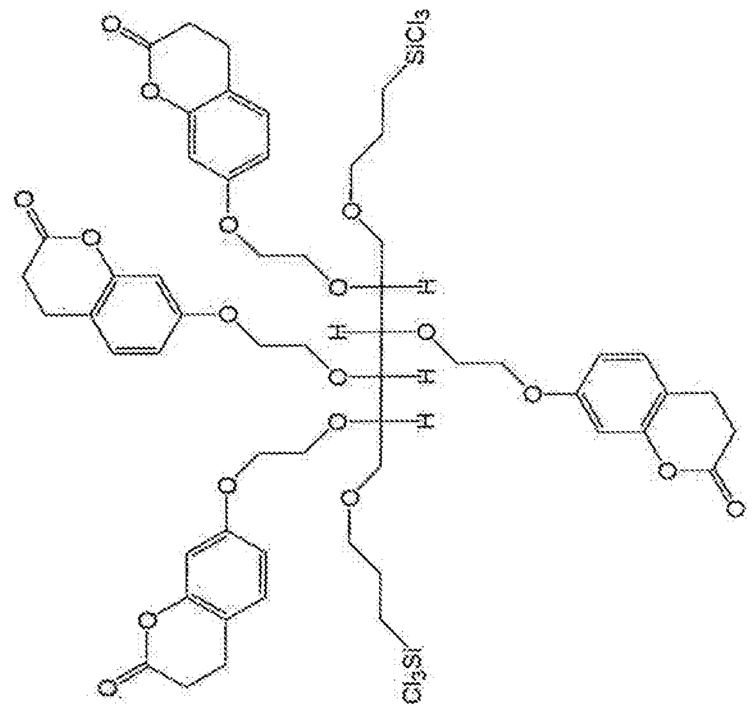

Repeat use of reference characters in the present specification and drawings is intended to represent the same or analogous features or elements of the present invention,

The invention claimed is:

1. A charge transporting, liquid crystal photoalignment material comprising hole transporting moiety and a liquid crystal photoalignment moiety wherein both the hole transporting moiety and the liquid crystal photoalignment moiety form at least one single fused aromatic ring system which constitutes a combined hole transporting and liquid crystal photoalignment moiety and wherein the hole transporting moiety and the liquid crystal photoalignment moiety of the at least one single fused aromatic ring system are not separated by one or more linkages, and wherein the combined hole transporting and liquid crystal photoalignment moiety is connected through a covalent chemical bond to a surface derivatising moiety.

2. The charge transporting, liquid crystal photoalignment material of claim 1, wherein the combined hole transporting and liquid crystal photoalignment moiety includes a hole transporting moiety having the following structure:

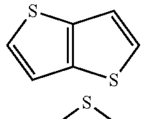
,
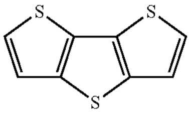
,
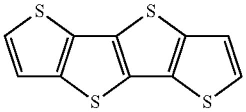
,
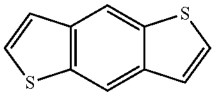
,
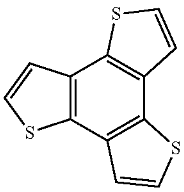
,
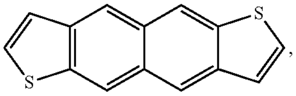
,
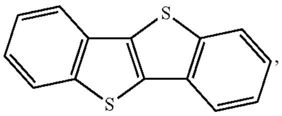
,
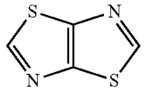
,
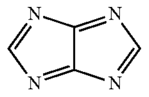
,
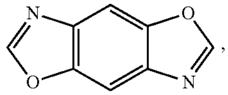
, or
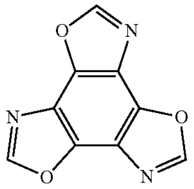
.

3. The charge transporting, liquid crystal photoalignment material of claim 1, wherein the combined hole transporting and liquid crystal photoalignment moiety comprises a photoalignment moiety including one or more of a cinnamate ester, a coumarin, a quinolinone, or a benzo[b]thiinone.

4. The charge transporting, liquid crystal photoalignment material of claim 1, wherein the combined hole transporting and liquid crystal photoalignment moiety is chosen from:

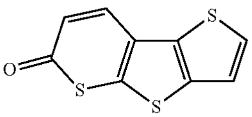
or
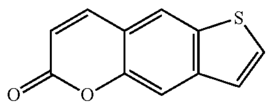
.

5. The charge transporting, liquid crystal photoalignment material of claim 1, wherein the surface derivatising moiety comprises a trihalosilanyl group, a trialkoxysilanyl group, or a Werner complex of transition metals.

6. The charge transporting, liquid crystal photoalignment material of claim 5, wherein the surface derivatising moiety is selected from the group consisting of a trichlorosilanyl group, a triethoxysilanyl group, a trimethoxysilanyl group, a μ-carboxylato-μ-hydroxido-bis[aquadichloridoethanolchromium(III)] group, an alkali metal enolate salt of a 1,3-dialkyl substituted pentane-1,3-dione, an alkaline earth metal enolate salt of a 1,3-dialkyl substituted pentane-1,3-dione, and an alkali metal salt of a dialkylamine.

7. The charge transporting, liquid crystal photoalignment material of claim 1, wherein the surface derivatising moiety is connected to the combined hole transporting and liquid crystal photoalignment moiety by a flexible linkage, wherein the flexible linkage is a flexible ethylene, a flexible trimethylene, or a flexible hexamethylene linkage.

8. A charge transporting layer fabricated by first forming a layer comprising the charge transporting, liquid crystal photoalignment material of claim 1, then coating a layer of a charge transporting reactive mesogen material onto the charge transporting, liquid crystal photoalignment layer, then crosslinking the charge transporting reactive mesogen.

9. The charge transporting layer of claim 8, wherein the charge transporting layer has a uniformly aligned liquid crystalline structure.

10. The charge transporting layer of claim 8, wherein the charge transporting layer has a uniformly aligned nematic structure.

* * * * *